United States Patent
Chen et al.

(10) Patent No.: US 10,692,785 B2
(45) Date of Patent: Jun. 23, 2020

(54) SEMICONDUCTOR PATTERN FOR MONITORING OVERLAY AND CRITICAL DIMENSION AT POST-ETCHING STAGE AND METROLOGY METHOD OF THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chien-Hao Chen, Tainan (TW); Chien-Wei Huang, Tainan (TW); Chia-Hung Wang, Taichung (TW); Sho-Shen Lee, New Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 16/057,826

(22) Filed: Aug. 8, 2018

(65) Prior Publication Data
US 2018/0374765 A1  Dec. 27, 2018

Related U.S. Application Data

(62) Division of application No. 15/630,966, filed on Jun. 23, 2017, now Pat. No. 10,079,185.

(51) Int. Cl.
*H01L 23/58* (2006.01)
*H01L 29/10* (2006.01)
*H01L 21/66* (2006.01)

(52) U.S. Cl.
CPC .............. *H01L 22/30* (2013.01); *H01L 22/12* (2013.01)

(58) Field of Classification Search
CPC .......... G03F 1/38; G03F 7/20; G03F 7/70633; G03F 7/70683; G03F 7/70616;
(Continued)

(56) References Cited

U.S. PATENT DOCUMENTS 6,137,578 A * 10/2000 Ausschnitt .......... G03F 7/70625
356/399
7,804,994 B2  9/2010 Adel
(Continued)

FOREIGN PATENT DOCUMENTS

| CN | 1818790 A | 8/2006 |
| CN | 104281010 A | 1/2015 |

(Continued)

OTHER PUBLICATIONS

Tabery et al., "Use of Design Pattern Layout for Automated Metrology Recipe Generation", Proceedings of SPIE, May 10, 2005, cover page and pp. 1424-1434, vol. 5752.

*Primary Examiner* — Meiya Li
(74) *Attorney, Agent, or Firm* — Winston Hsu

(57) ABSTRACT

A semiconductor pattern for monitoring overlay and critical dimension at post-etching stage is provided in the present invention, which include a first inverted-T shaped pattern with a base portion and a middle portion extending from the base portion and a second pattern adjacent and spaced apart from the base portion of the first inverted-T shaped pattern, wherein the first inverted-T shaped pattern and the second pattern are composed of a plurality of spacer patterns spaced apart from each other.

3 Claims, 5 Drawing Sheets

(58) Field of Classification Search
CPC ....... G03F 7/0623; G01B 11/02; G01B 11/08; G06F 17/5068
See application file for complete search history.

(56) References Cited

U.S. PATENT DOCUMENTS

| | | | |
|---|---|---|---|
| 8,013,984 B2 * | 9/2011 | Gonzalez Cruz | G01J 3/4406 |
| | | | 356/417 |
| 9,470,987 B1 | 10/2016 | Lin | |
| 9,595,419 B1 | 3/2017 | Monahan | |
| 2005/0273754 A1 * | 12/2005 | Nojima | G03F 1/36 |
| | | | 716/52 |
| 2010/0293812 A1 | 11/2010 | Coulson | |
| 2012/0074400 A1 | 3/2012 | Shieh | |
| 2015/0287176 A1 * | 10/2015 | Coskun | G03F 7/70433 |
| | | | 382/144 |
| 2016/0062227 A1 | 3/2016 | Yang | |
| 2016/0266505 A1 | 9/2016 | Amit | |
| 2017/0005015 A1 | 1/2017 | Li | |

FOREIGN PATENT DOCUMENTS

| | | |
|---|---|---|
| WO | 2015/193904 A1 | 12/2015 |
| WO | WO 2016206965 | 12/2016 |

\* cited by examiner

SEMICONDUCTOR PATTERN FOR MONITORING OVERLAY AND CRITICAL DIMENSION AT POST-ETCHING STAGE AND METROLOGY METHOD OF THE SAME

CROSS REFERENCE TO RELATED APPLICATIONS

This application is a divisional application of application Ser. No. 15/630,966, filed on Jun. 23, 2017 and entitled "SEMICONDUCTOR PATTERN FOR MONITORING OVERLAY AND CRITICAL DIMENSION AT POST-ETCHING STAGE AND METROLOGY METHOD OF THE SAME", which is incorporated herein by reference.

BACKGROUND OF THE INVENTION

1. Field of the Invention

The present invention relates generally to a semiconductor pattern, and more specifically, to a semiconductor pattern and corresponding metrology method for monitoring overlay and critical dimension (CD) at post-etching stage.

2. Description of the Prior Art

Methods of shrinking line-widths in lithographic processes have historically involved using greater numerical aperture (NA) optics, shorter exposure wavelengths, or interfacial media other than air (e.g., water immersion). As the resolution of traditional photolithographic process has approached theoretical limits, manufacturers have started to turn to double-patterning (DP) methods to overcome optical limitations. In DP lithography, the pattern is formed in two passes through the lithography cell. In some instances, the first pattern is etched into the substrate prior to the second pass; while in other instances, the first and second pass through the lithography cell is performed without an intermediate etch. The former method is referred to as Litho-Etch-Litho-Etch double patterning (LELE), and the latter as Litho-Litho-Etch double patterning (LLE). The processing steps necessary to form the pattern for the first and second pass are effectively identical in both the LELE and LLE methods.

As it is shown in FIG. 1 and FIG. 2, in self-aligned double patterning (SADP) process, self-aligned double patterns 14 such as spacers will be formed around predetermined mandrels (not shown) on a mask or a target layer. An etch process will be performed using the predetermined photoresist (PR) 12 as a mask to remove the unnecessary double patterns in predetermined empty areas. This etch process would remove all of the self-aligned double patterns or spacer not covered by the photoresist. In practice, the issue of etching bias and PR overlay shift in photolithographic process would result in unexpected patterns, such as the incomplete self-aligned double patterns 14a shown in FIG. 2, These unexpected patterns would make the measurement of critical dimension more difficult at the stage of after etch inspection (AEICD). Especially, when the above mentioned cases both occurred during the photolithographic and etching process, the root cause for the critical dimension (CD) shifts or overlay shift of the resulted patterns cannot be determined, thus the in-line monitoring and dispatching for the products cannot be achieved, which will undoubtedly produce a huge loss.

In addition, the measurement of overlay between successive patterned layers on a wafer is also one of the critical factors required for process control in the manufacturing of integrated circuits and devices. Overlay generally pertains to the determination of how accurately a first patterned layer aligns with respect to a second patterned layer disposed above or below it. In this case, it is necessary to monitor and control the overlay condition of the photoresist used to cover the self-aligned double patterns. Presently, overlay measurements are performed via targets that are printed together with layers of the wafer.

SUMMARY OF THE INVENTION

The problems noted above are solved by providing a semiconductor pattern and corresponding metrology method specifically designed for monitoring overlay and critical dimension (CD) at post-etching stage. The semiconductor patterns provided by the present invention may be used not only in the CD measurement at post-etching stage, but also in the detection of overlay shift and corner rounding effect.

To achieve the aforesaid objective, a semiconductor pattern is provided in one embodiment of the present invention, which includes a first inverted-T shaped pattern with a base portion extending in a first direction and a middle portion extending from the base portion in a second direction orthogonal to the first direction, and a second pattern adjacent and spaced apart from the base portion of the first inverted-T shaped pattern, wherein the first inverted-T shaped pattern and the second pattern are composed of a plurality of spacer patterns spaced apart from each other and extending in the second direction.

To achieve the aforesaid objective, a metrology method using the above-specified semiconductor pattern is provided in one embodiment of the present invention, which includes the steps of measuring the spacing between the base portion and the second pattern and measuring the width of the base portion in the second direction for monitoring the critical dimension of line patterns and space regions after an etch process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For a more complete understanding of the embodiments, and the advantages thereof, reference is now made to the following descriptions taken in conjunction with the accompanying drawings, in which.

Figure 1:
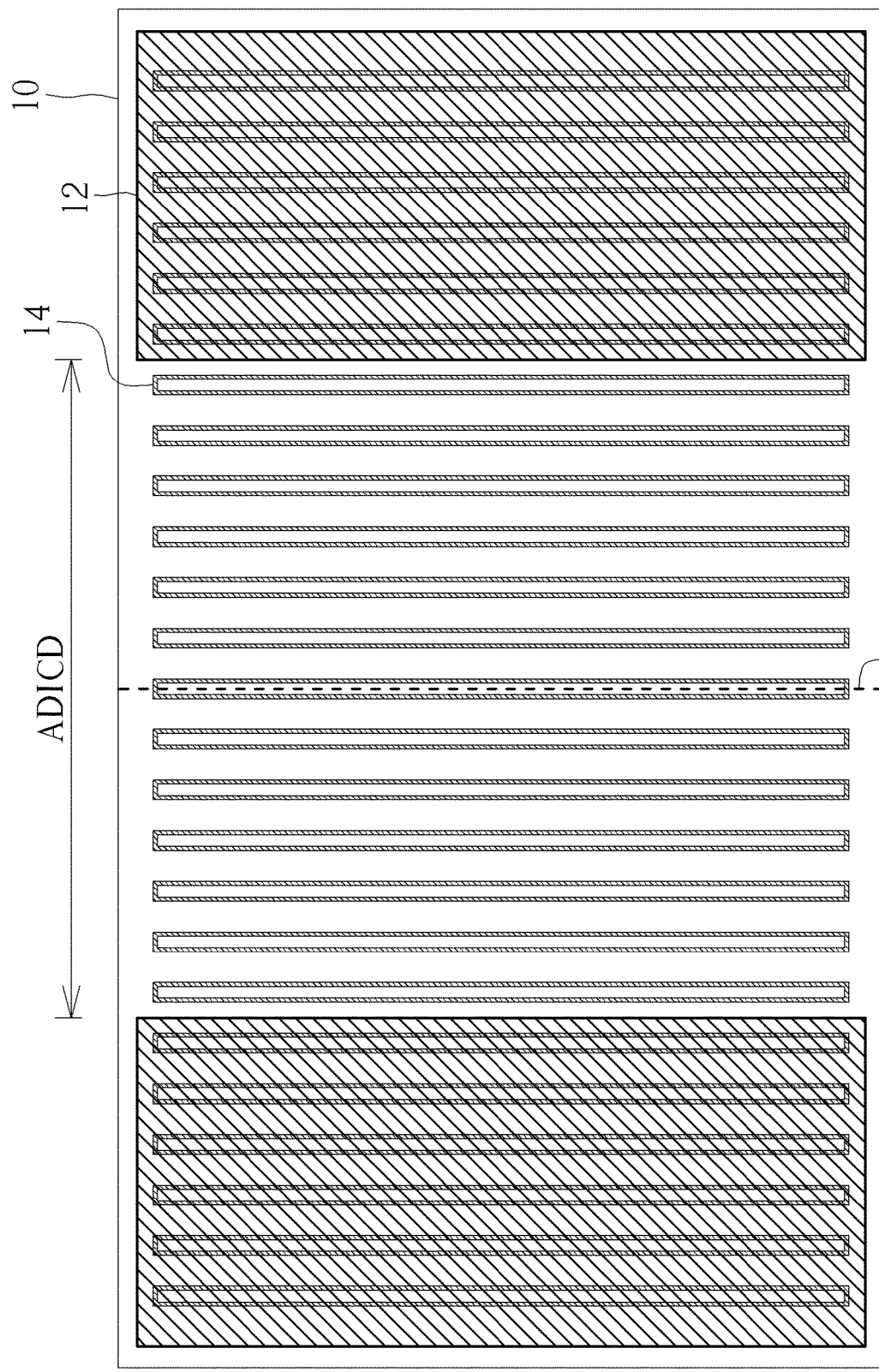
FIG. 1 and FIG. 2 are top views schematically illustrating a self-aligned double patterning (SADP) process in prior art.
Figure 2:
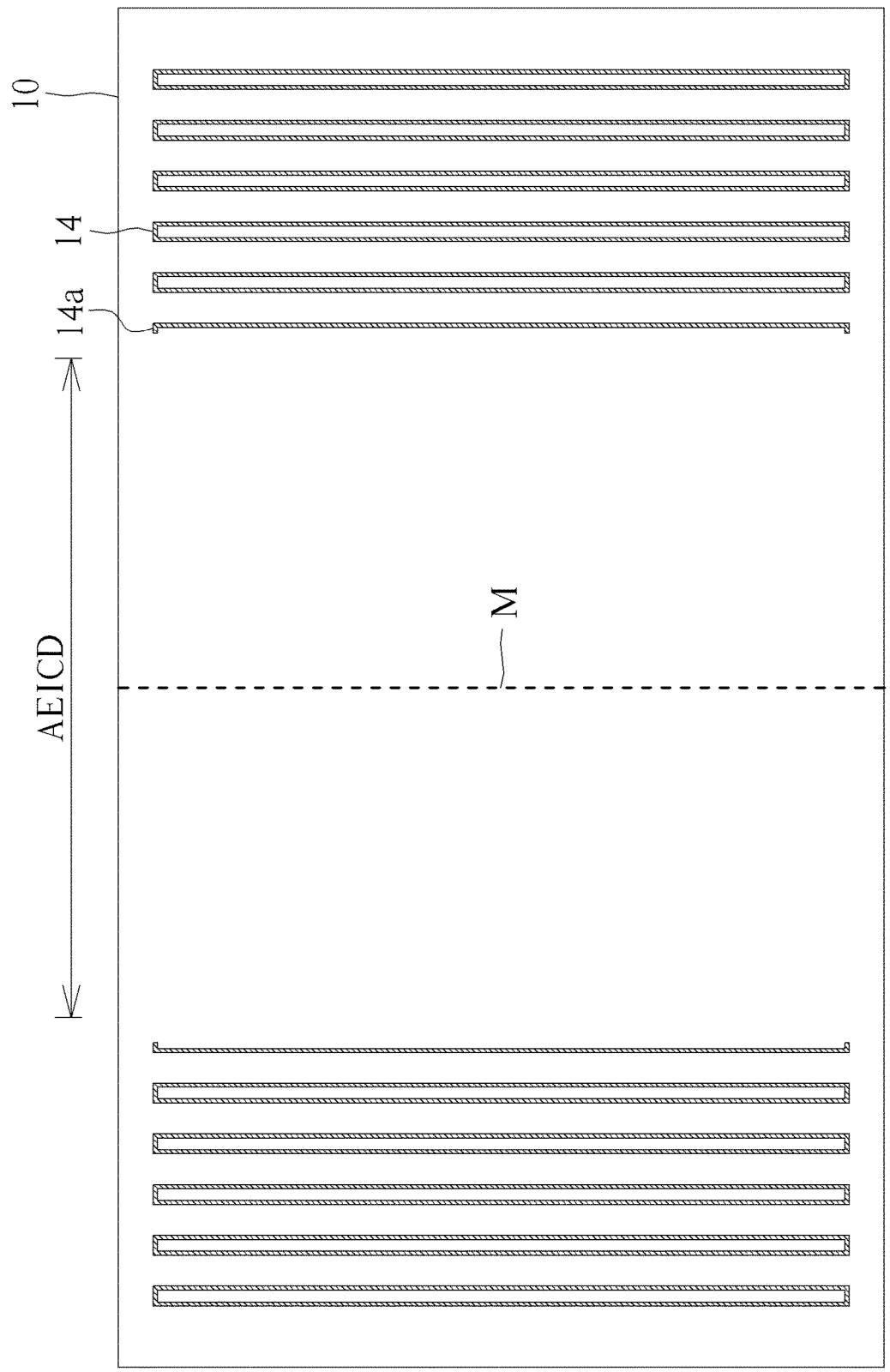

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of components and regions may be exaggerated for clarity unless express so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
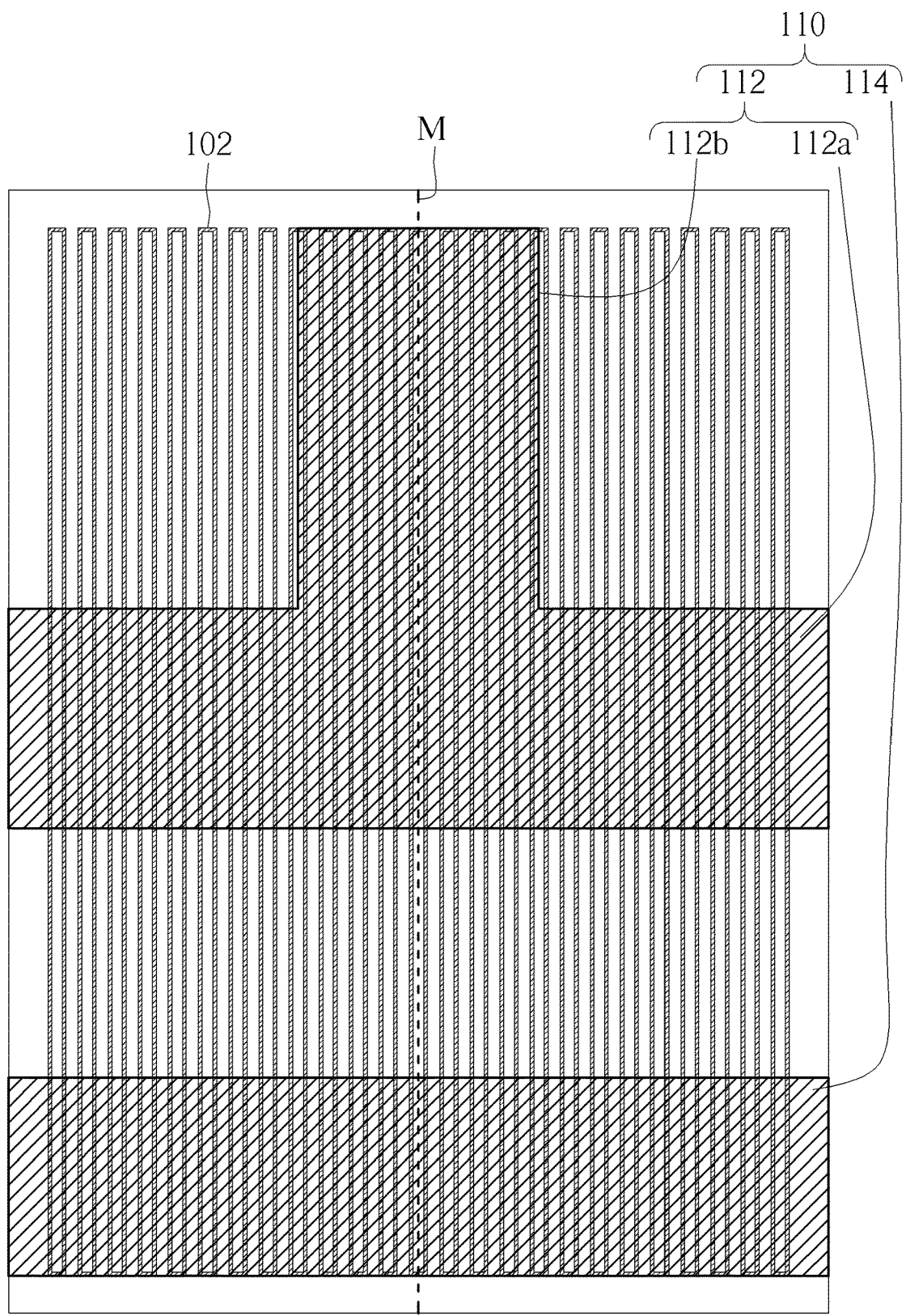
FIG. 3 is a schematic top view of the self-aligned double patterns before the etch process in accordance with one embodiment of the present invention.

First, please refer to FIG. 3. FIG. 3 is a schematic top view of the self-aligned double patterns before the etch process. In the preferred embodiment, a fin pitch of the fins to be formed is beyond the capability of current single exposure lithography system and technology using 193 nm immersion lithography tool, and thus the multiple patterning process, such as a self-aligned double patterning (SADP) process is used to form the patterned hard mask defining the placement and the size for the fins. In this process, a plurality of mandrel patterns (not shown) are formed on the substrate 100, and a width of the mandrel patterns and/or spacing distance between the mandrel patterns are used to define a spacing distance between the fins to be formed. Next, a material layer is blanketly formed on the substrate 100, and an etching rate of the material layer is different from an etching rate of the mandrel patterns. The material layer is then etched back to form a plurality of spacers around the mandrel patterns, and followed by removing the mandrel patterns. Consequently, a plurality of spacer patterns 102 are formed on the substrate 100, and the spacer patterns 102 will be used to define placement and size of fin patterns to be formed.

Refer again to FIG. 3. After the spacer patterns 102 are formed, an etch process will be performed to remove unnecessary spacer patterns 102 on predetermined empty region and/or to cut both ends of each spacer patterns for transforming the loop-type spacers into stripe patterns spaced and separated apart from each other. A photoresist will be used to cover the portions of spacer patterns 102 that should be kept on the substrate 100. In this photolithographic process, a photoresist pattern 110 with special shapes and sections is provided in the present invention to cover on a portion of the spacer patterns 102 in order to form the specific semiconductor patterns for monitoring overlay and critical dimension. This semiconductor pattern may be formed in scribe line with other testing patterns. As it is shown in FIG. 3, the photoresist pattern 110 includes a first inverted-T shaped pattern 112 and a second pattern 114 adjacent and spaced apart to the first inverted-T shaped pattern 112. More specifically, the first inverted-T shaped pattern 112 of the photoresist pattern 110 is provided with a base portion 112a extending in a first direction L1 and a middle portion 112b extending from the base portion 112a in a second direction L2 orthogonal to the first direction L1.

Please note that the photoresist pattern 110 shown in FIG. 3 is a part of the photoresist (not shown) formed on the entire substrate in the photolithographic process to define the patterns and layout of the entire integrated circuit. The photoresist pattern 110 formed in FIG. 3 will be used to define the semiconductor patterns for monitoring overlay and critical dimension after a subsequent etch process (e.g., at post-etching stage) as provided by the present invention. In this way, the semiconductor pattern resulted from the photoresist pattern 110 by the etch process may substantially reflect the overlay condition of the photoresist and the etching condition of the etch process.

Figure 4:
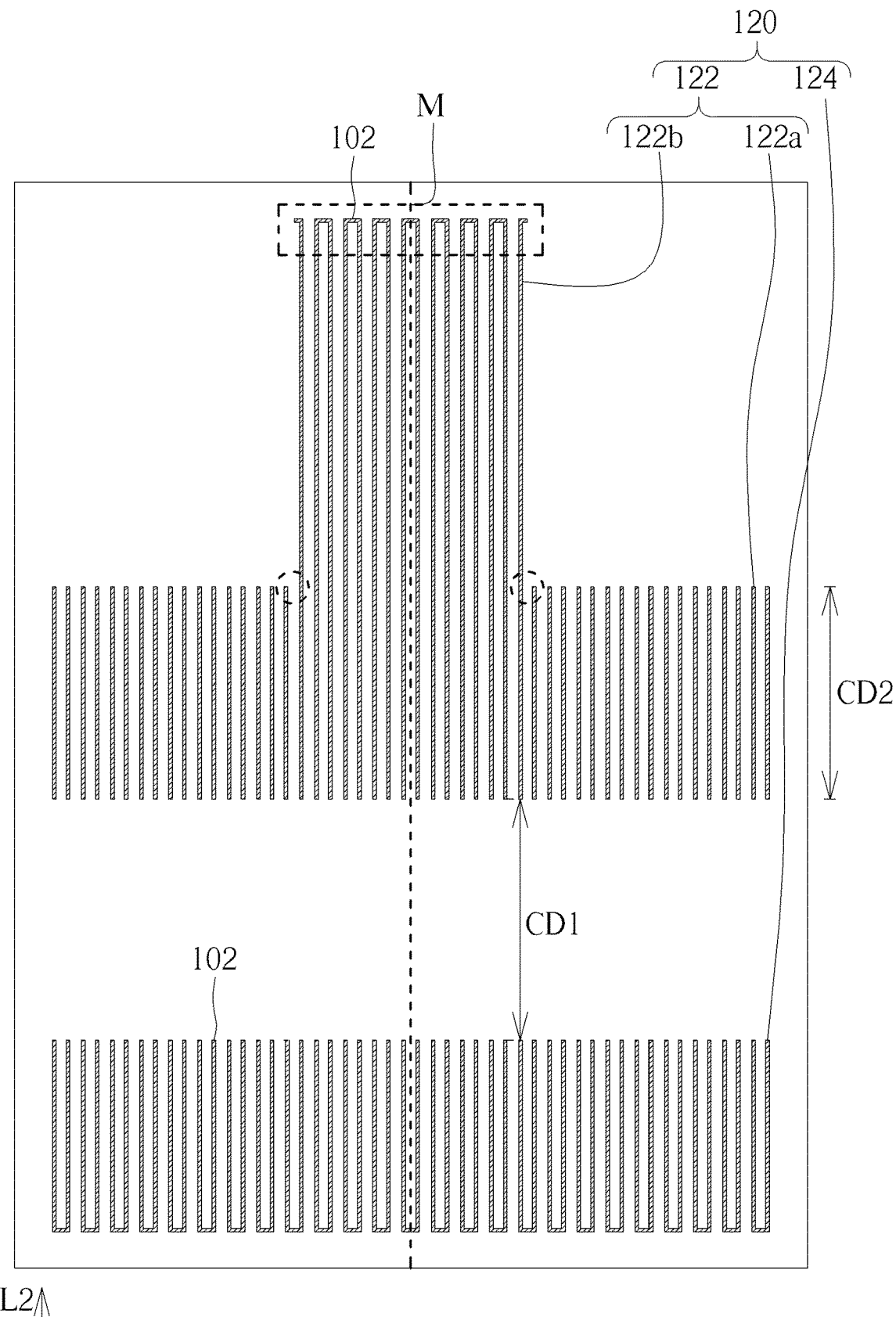
FIG. 4 is a schematic top view of the semiconductor pattern formed of the self-aligned double patterns after the etch process in accordance with one embodiment of the present invention.

Refer now to FIG. 4. After the photoresist pattern 110 is formed, an etch process is performed using the photoresist, including the part of the photoresist pattern 110, as an etch mask to remove the unnecessary spacer patterns 102 on empty areas and to form necessary semiconductor patterns on the substrate 100. It is noted that the semiconductor pattern 120 formed in FIG. 4 by the photolithographic and etch process has exactly the same shape as the photoresist pattern 110 in FIG. 3, except that the semiconductor pattern 120 is composed of the spacer or stripe patterns 102. The semiconductor pattern 120 includes a first inverted-T shaped pattern 122 with a base portion 122a extending in the first direction L1 and a middle portion 122b extending from the base portion 122a in the second direction L2 orthogonal to the first direction L1, and a second pattern 124 adjacent and spaced apart from the base portion 122a of the first inverted-T shaped pattern 122. It should be noted that the first inverted-T shaped pattern 122 and the second pattern 124 are composed of a plurality of the spacer patterns 102 (or stripe patterns if their ends are cut off and separated) spaced apart from each other and extending in the second direction L2.

The semiconductor pattern 120 provided by the present invention is designed in the shape for multiple metrology purposes, which will be explained respective as following:

(1) For the spacing between the base portion 122b and the second pattern 124, the CD1 value of the spacing may be measured to determine the etching bias of the etch process for space areas on the substrate in post-etch stage or after etch inspection (AEI) stage. This measurement is critical for detecting the etching bias if the CD1 value is shifted from the predetermined value in the middle or near the edge of the semiconductor pattern 110.

(2) The measured CD2 value (i.e. the width) of the base portion 122b in the second direction L2 may be used to determine the etching bias of the etch process in the lines, fins or dense region at post-etch stage. This measurement is also critical for detecting the etching bias if the CD2 value is shifted from the predetermined value near the corner or near the edge of the semiconductor pattern 110.

(3) The corner between the middle portion 122b and the base portion 122a (marked by dashed circle) may be inspected at AEI stage for detecting and checking the extent of corner rounding effect.

(4) The overlay condition between the preceding layer and the present layer may also be monitored by the proposed semiconductor pattern 120 in the present invention. Please refer again to FIG. 4, through the inspection at the end and corners (marked by dash frame) of the middle portion 122a of the first inverted-T shaped pattern 122, the overlay condition or shift may be determined by checking the symmetry of the spacer or stripe patterns with respect to the middle line M of the middle portion 122a. The asymmetric pattern distribution in the dash frame may reflect that the photoresist pattern 110 formed in previous step is not precisely aligned and overlayed on the substrate and the target layer.

(5) The same criterion for overlay shift issue may also be applied in the metrology of base portion 122b. By counting the number of the spacer or stripe patterns at both sides of the middle portion 122a in the base portion 122b, the result of unequal number of the strip patterns at both sides of the middle portion 122a may reflect the overlayer (ex. the photoresist) is significantly shifted from its predetermined position. The existence of any incomplete spacer patterns in this area may also reflect that the photoresist is not properly aligned.

Figure 5:
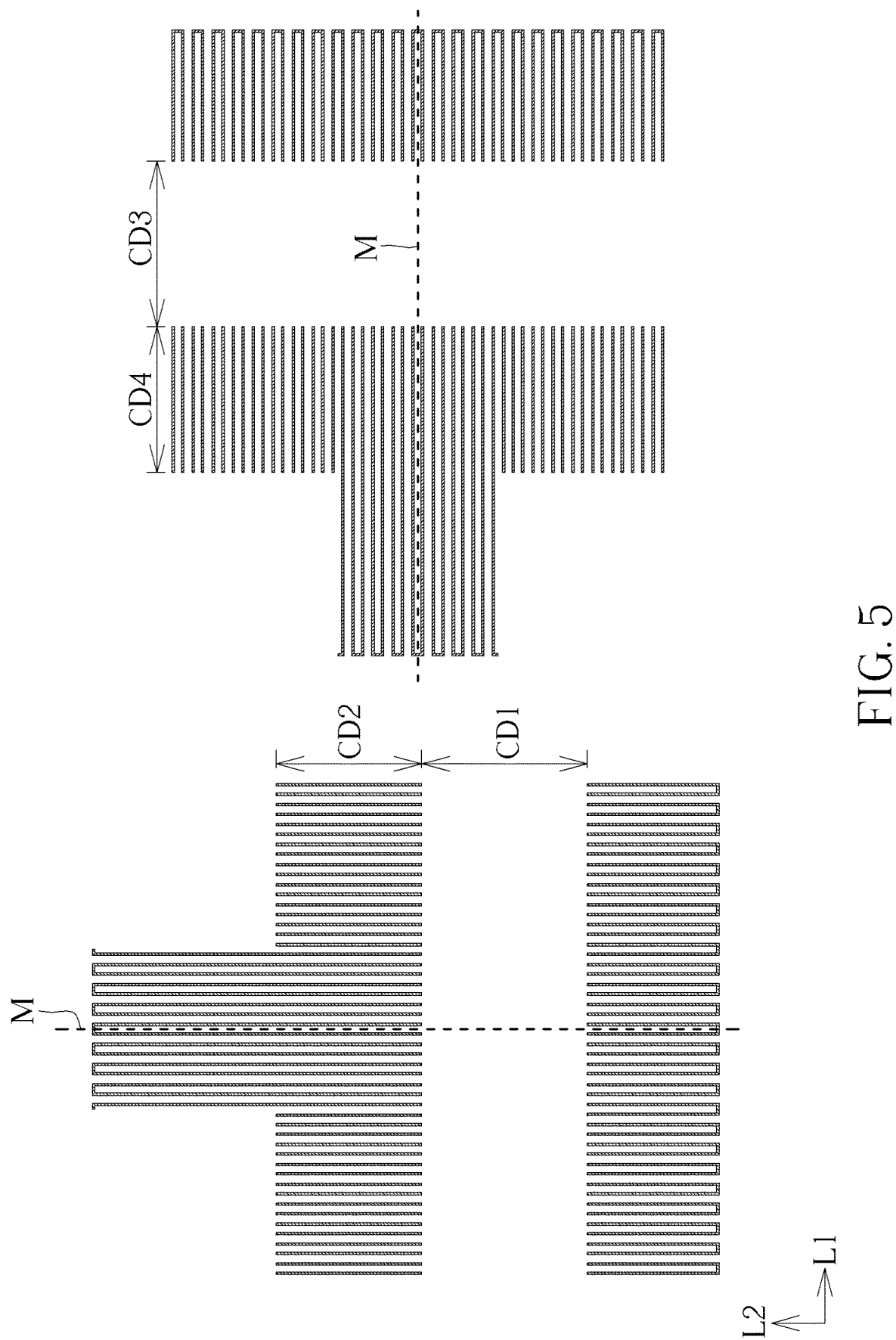
FIG. 5 is a schematic top view of the semiconductor pattern formed of the self-aligned double patterns after the etch process in accordance with another embodiment of the present invention.

The semiconductor pattern 120 provided in FIG. 4 may show and be used to determine the overlay shift in only the first direction L1. To monitor the shifts in both the first direction L1 and the second direction L2, in another embodiment of the present invention as shown in FIG. 5, an additional semiconductor pattern with same inverted-T shaped pattern and the second pattern in an orthogonal orientation may be added to cooperate with the original pattern. The critical dimension, such as CD3 and CD4 shown in the figure, in different orientation may also be measured for the monitor purpose.

The advantage of the above-identified semiconductor patterns and corresponding metrology method is that multiple measurement and inspection for process control and monitor may be achieved by simple semiconductor patterns in one single step without additional cost or process modification.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor pattern for monitoring an overlay and a critical dimension at a post-etching stage, comprising:
    a first inverted-T shaped pattern with a base portion extending in a first direction and a middle portion extending from said base portion in a second direction orthogonal to said first direction; and
    a second pattern adjacent and spaced apart from said base portion of said first inverted-T shaped pattern, wherein said first inverted-T shaped pattern is composed of a plurality of first spacer patterns spaced apart from each other and extending in said second direction, and said second pattern is composed of a plurality of second spacer patterns spaced apart from each other and extending in said second direction.

2. The semiconductor pattern for monitoring the overlay and the critical dimension at a post-etching stage of claim 1, wherein said first inverted-T shaped pattern is symmetric with respect to said middle portion.

3. The semiconductor pattern for monitoring the overlay and the critical dimension at a post-etching stage of claim 1, wherein said plurality of first spacer patterns are self-aligned double patterns, and said plurality of second spacer patterns are self-aligned double patterns.

* * * * *